United States Patent [19]
Nakano

[11] Patent Number: 4,758,848
[45] Date of Patent: Jul. 19, 1988

[54] METHOD AND APPARATUS FOR MARKING A PATTERN ON AN ARTICLE WITH A LASER INCLUDING PARTIAL FEEDBACK OF THE LASER OUTPUT FOR GENERATING THE MARKING BEAM

[75] Inventor: Masakazu Nakano, Tokyo, Japan

[73] Assignee: NEC Corporation, Japan

[21] Appl. No.: 934,713

[22] Filed: Nov. 25, 1986

[30] Foreign Application Priority Data

Nov. 28, 1985 [JP] Japan .................................. 60-266098

[51] Int. Cl.[4] .............................................. C01D 9/42
[52] U.S. Cl. .................................. 346/108; 219/121.67
[58] Field of Search ................. 346/108, 107 R, 76 L, 346/160; 219/121 LG, 121 LH, 121 LJ, 121 LT

[56] References Cited

U.S. PATENT DOCUMENTS

| 4,013,466 | 3/1977 | Klaiber | 350/351 X |
| 4,358,659 | 11/1982 | Spohnheimer | 219/121 LH X |
| 4,559,546 | 12/1985 | Yip | 346/160 |
| 4,586,053 | 4/1986 | Hughes | 346/108 X |
| 4,609,566 | 9/1986 | Hongo et al. | 346/108 X |

Primary Examiner—E. A. Goldberg
Assistant Examiner—Mark Reinhart
Attorney, Agent, or Firm—Ostrolenk, Faber, Gerb & Soffen

[57] ABSTRACT

In a method and apparatus for marking a pattern on an article with a laser, a device for producing a mask pattern in accordance with an electro-optical effect is utilized so that any reflection of laser energy off of the mask pattern is avoided. Further, laser energy not utilized for the marking of the pattern is fed back to a stage previous to the mask pattern stage. Accordingly, the energy efficiency of laser usage is increased and parts used therein is not damaged by undesirable reflection of laser beams.

5 Claims, 5 Drawing Sheets

FIG.2A    FIG.2B    FIG.2C    FIG.2D
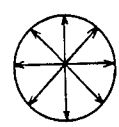 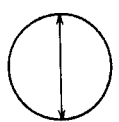 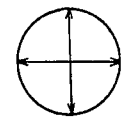 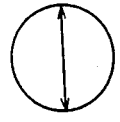
FIG.2E    FIG.2F
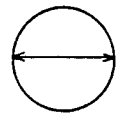 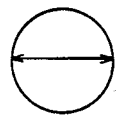

METHOD AND APPARATUS FOR MARKING A PATTERN ON AN ARTICLE WITH A LASER INCLUDING PARTIAL FEEDBACK OF THE LASER OUTPUT FOR GENERATING THE MARKING BEAM

FIELD OF THE INVENTION

The invention relates to a method and an apparatus for marking a pattern on an article with a laser. It relates more particularly to a method and an apparatus of marking a pattern on an article with a laser, in which a laser beam which is not to be utilized for the marking of the pattern is fed back to the stage prior to means for generating a mask pattern to increase the energy efficiency of the laser and to avoid the damage of parts to be used therein.

BACKGROUND OF THE INVENTION

A conventional apparatus for marking a pattern on an article with a laser comprises a light source from which a laser beam radiates, a mask pattern on a thin metal plate or glass on which a predetermined mark (such as the name of a manufacturer of products or a number of a lot thereof, like IC plastic mold packages, transistors etc.) is formed; and a lens system by which the laser beam is focussed on the products as mentioned above to mark the pattern thereon in accordance with the energy thereof.

In operation, the light source is driven with by use of a predetermined high frequency power source so that the laser beam radiates therefrom to be passed through the mask pattern. The laser beam which is passed through the mask pattern goes into the lens system thereby converging on the products to be marked so that the name of a manufacturer, number of a lot etc. thereof is marked thereon.

According to the conventional apparatus for marking a pattern on an article with a laser, however, the laser beam radiating from the light source is partly reflected by the non-letters portions of the mask pattern (in other words, portions through which the laser beam is interrupted and prevented from being passed). It is also partly reflected by the surface of the products to be marked etc. Thus, the laser beam is scattered from these surfaces. As a result, up to half the energy of the laser beam, or even more, is not utilized, so that the efficiency of energy is decreased. In addition, the energy of the laser beam that is reflected by the mask pattern is so large that parts to be used therein are damaged.

SUMMARY OF THE INVENTION

Accordingly, it is an object of the invention to provide a method and an apparatus of marking a pattern on an article with a laser in which a laser beam that is not to be utilized for the marking of a pattern is feed back to a stage previous to the mask pattern generating stage to increase the energy efficiency of the laser beam.

It is a further object of the invention to provide a method and apparatus of marking a pattern on an article with a laser in which parts to be used therein are not damaged due to any undesired reflection of the laser beam.

It is a still further object of the invention to provide a method and apparatus of marking a pattern on an article with a laser in which the construction thereof is not complicated.

According to one feature of the invention, a method of marking a pattern on an article with a laser comprises producing a laser beam having a predetermined plane of polarization from a non-polarized laser beam.

a mask pattern is generated in accordance with an electro-optical effect through which said laser beam is passed to produce laser beam having different planes of polarization. A laser beam having one of said different planes of polarization is selected to mark a pattern in accordance with said mask pattern on the article. A laser beam other than said laser beam having said predetermined plane of polarization produced from said non-polarized laser beam, and other than said laser beam having the remaining one of said different planes of polarization, is fed back to a stage previous to the mask pattern stage.

According to another feature of the invention, an apparatus for marking a pattern on an article with a laser comprises, means from which a non-polarized laser beam radiates, and a polarizer through which a laser beam having a predetermined plane of polarization is passed and by which a laser beam other than said laser beam having said predetermined plane of polarization is reflected following receiving said non-polarized laser beam. Means are provided for producing a mask pattern in accordance with an electro-optical effect from which a laser beam having different planes of polarization radiates in accordance with said mask pattern. An analyser receives the laser beam from the mask pattern means and passes a laser beam having one of said different planes of polarization and reflects a laser beam having the remaining one of said different planes of polarization. Means are then provided for focussing said laser beam having said one of said different planes of polarization on the article to mark the pattern in accordance with said mask pattern thereon. There are also means for feeding laser beams reflected by said polarizer and said analyser back to a stage previous to said polarizer.

BRIEF DESCRIPTION OF THE DRAWINGS

An embodiment of the invention will be explained in detail in accordance with the following drawings wherein, FIGS. 2A to 2F are explanatory diagrams showing the planes of polarization of the various laser beams in FIG. 1.

DESCRIPTION OF THE PREFERRED EMBODIMENT

Figure 1:
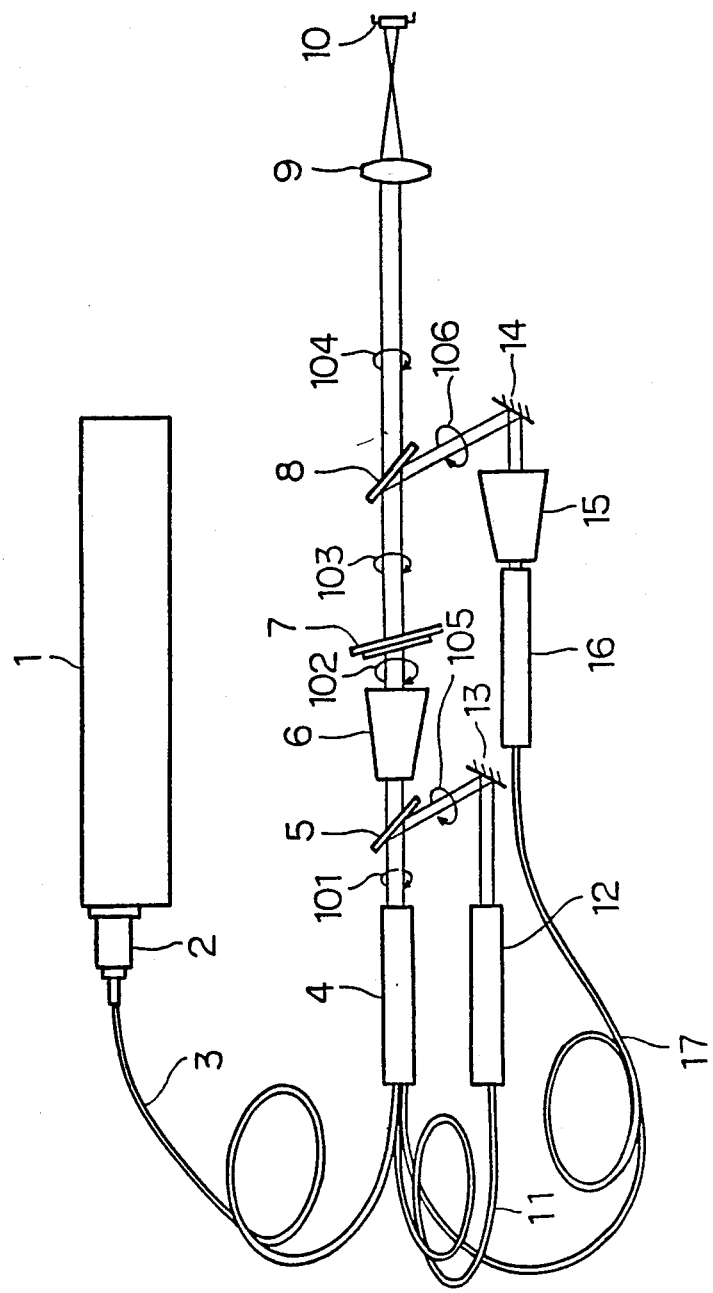
FIG. 1 is an explanatory diagram showing an embodiment of a method and apparatus of for marking a pattern on an article with a laser according to the invention.

In FIG. 1, there is shown an embodiment of a method and apparatus for marking a pattern on an article with a laser according to the invention. The apparatus comprises a laser oscillator 1 including a Nd:YAG laser device (not shown) from which a laser beam radiates, a coupler 2 which is attached to the laser oscillator 1, and a collimator 4 which is connected to the laser oscillator 1 through an optical fiber 3 which is connected to the coupler 2. A polarizer 5 is positioned on a slant with a predetermined angle, for instance, 20 degrees, to the path of laser beam 101 which radiates from the collimator 4. An expander 6 is composed of a concave cylindrical lens (not shown) and a convex cylindrical lens (not shown) and is positioned in the path of laser beam from the polarizer 5. A liquid crystal device (LCD) 7 is positioned on a slant with a predetermined angle, for instance, 20 degrees to the path of laser beam 102 from the expander 6. The LCD 7 functions as a light valve by the application of AC voltage in accordance with a pattern to be marked on an article 10, as described later in more detail. An analyser 8 is positioned on a slant with a predetermined angle, for instance, 20 degrees, to the path of laser beam 103 from the liquid crystal device 7, and a lens 9 is for focussing laser beam 104 which is passed through the analyser 8 to mark the pattern on the article 10.

The apparatus further comprises a reflecting mirror 13 for reflecting laser beam 105 reflected by the polarizer 5, a coupler 12 for coupling the laser beam 105 reflected by the reflecting mirror 13 to an optical fiber 11 through which the laser beam 105 is fed back to the collimator 4. A reflecting mirror 14 is for reflecting laser beam 106 reflected by the analyser 8, a reducer 15 for reducing a flux diameter of the laser beam 106 reflected by the reflecting mirror 14, and a coupler 16 is for coupling a laser beam from the reducer 15 to an optical fiber 17 through which the laser beam is fed back to the collimator 4.

Figure 3:
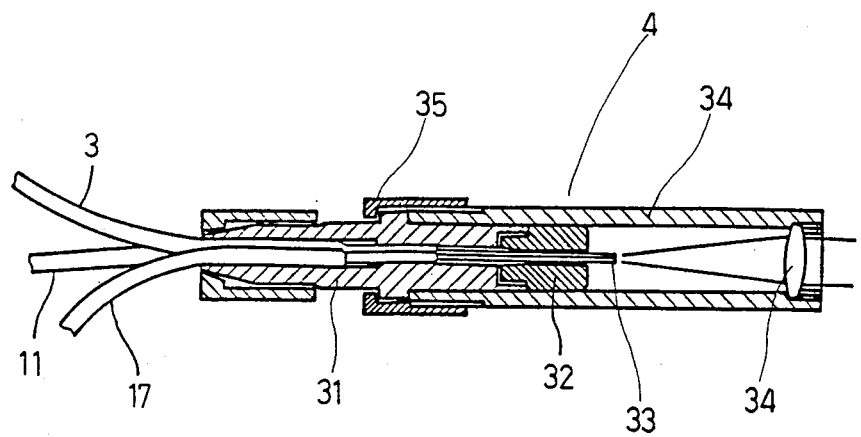
FIG. 3 is a cross sectional view illustrating the collimator of FIG. 1.

In FIG. 3, there is shown a collimator 4 which comprises a guide member 31 into which optical fibers 3, 11 and 17 are introduced, a fixing member 32 for fixing three cores 33 of the optical fibers 3, 11 and 17 to be assembled in position, a convex lens 34 for collimating a laser beam radiating from the three cores 33, an outer body 34 for accommodating the guide and fixing member 32 and the convex lens 34, and a screw nut 35 for fastening the guide member 31 to the outer body 34.

Figure 5:
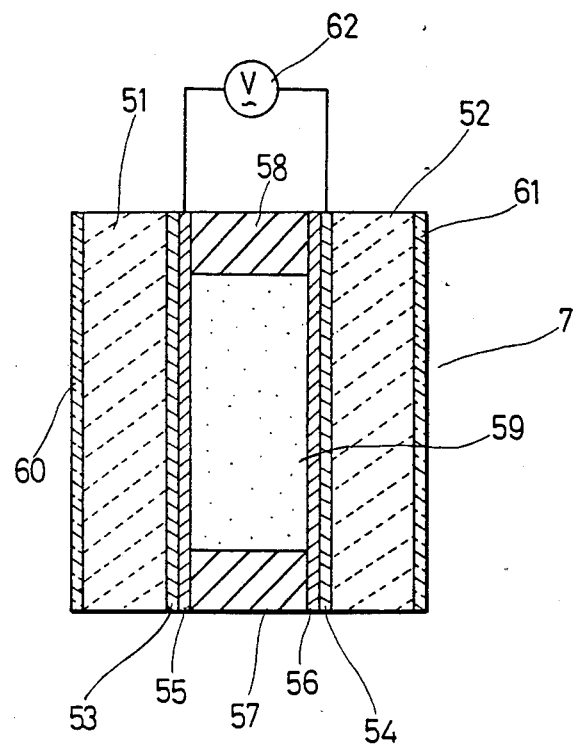
FIG. 5 is a cross sectional view illustrating the liquid crystal device of FIG. 1.

In FIG. 5, there is shown a liquid crystal device 7 which comprises glass substrates 51 and 52, a plurality of X-transparent electrodes 53 each provided on the inner surface of the glass substrate 51, a plurality of Y-transparent electrodes 54 each provided on the inner surface of the glass substrate 52, orientating layers 55 and 56 respectively provided at the inside of the X and Y-electrodes 53 and 54, spacers 57 and 58 for facing the orientating layers 55 and 56 with a predetermined distance to form a chamber, liquid crystal layer 59 which is accommodated in the chamber, and non-reflective layers 60 and 61 for preventing laser beam 102 from being reflected thereby. AC voltage is applied from a driver circuit 62 between the X and Y-electrodes 53 and 54 in accordance with a pattern to be marked on an article.

Figure 6:
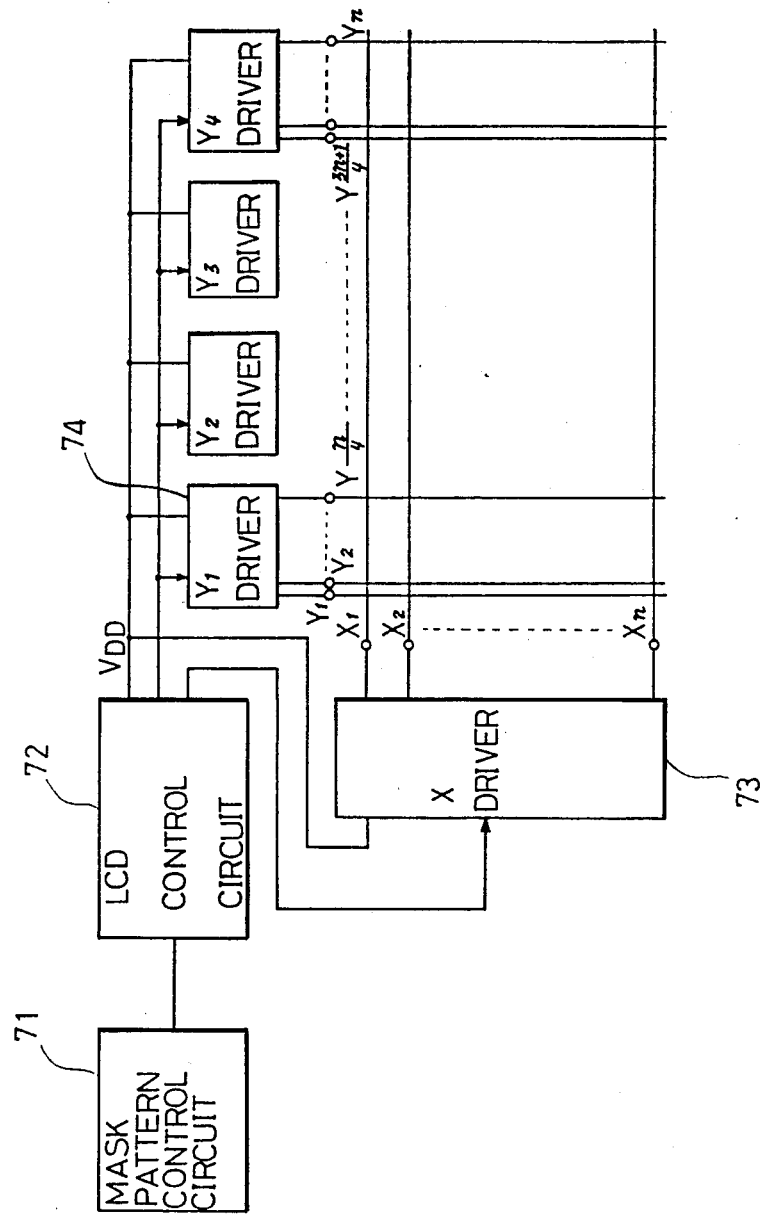
FIG. 6 is a block diagram showing a driver circuit for the liquid crystal device of FIG. 5, and FIGS. 7A to 7C are cross sectional views of optical fibers which are assembled by being fused to form a collimator.

In FIG. 6, there is shown a driver circuit for driving a liquid crystal device 7 which comprises a mask pattern control circuit 71 including a ROM for storing a program, a character generator for producing an image signal, a RAM for storing a pattern to be marked on an article in accordance with the image signal from the character generator etc. A liquid crystal device (LCD) control circuit 72 drives one of the X-electrodes $X_1$, $X_2$ - - - $X_n$ through a X-driver 73 in accordance with a line signal which is repetitively increased by one in such a manner that the electrode $X_1$ is first driven, the electrode $X_2$ is driven after the electrode $X_1$, and $X_3$ after $X_2$, and so forth. The LCD control circuit 72 also drives Y-electrodes $Y_1$, $Y_2$ - - - $Y_n$ through drivers 74 designated $Y_1$ to $Y_4$—in the accordance with the pattern stored in RAM of the mask pattern control circuit 71. The driver circuit mentioned above is designed such that the X and Y-electrodes $X_1$, $X_2$ - - - $X_n$ and $Y_1$, $Y_2$ - - - $Y_n$ are provided with a density of more than 10 dots/mm, preferably 20 dots/mm, and the electro-optical effect is maximized at the wavelength 1.06 $\mu$m of a Nd:YAG laser beam. Further, such elements as the liquid crystal, glass substrate, orientating layer etc. are selected in regard to the material thereof to endure the high energy of a laser beam. Still further, the liquid crystal device is designed such that non-reflecting layers are provided at both outer surfaces thereof to prevent parts used in the apparatus from being damaged due to the reflection and scattering of the laser beam.

Figure 4:
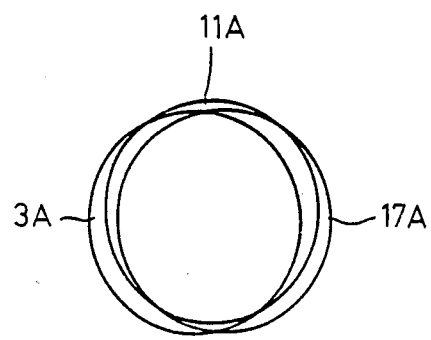
FIG. 4 is an explanatory view showing the light distribution of a collimated laser beam generated in FIG. 3.

In operation, a pattern to be marked on an article is designated by an operator so that the pattern is stored in RAM in accordance with the image signal from the character generator in the mask pattern control circuit 71. At the same time, the laser oscillator 1 is driven to produce the laser beam which is propagated through the optical fiber 3 and received by the collimator 4. FIG. 4 shows laser beams 3A, 11A and 17A which radiate from the optical fiber 3, 11 and 17 respectively and are collimated by the convex lens 34. The light flux is deviated in the laser beams 3A, 11A and 17A by the diameter of the respective optical fibers 3, 11 and 17 which results in a light distribution as shown in FIG. 4. The laser beam 101 radiating from the collimator 4 is shown to be non-polarized in FIG. 2A. A first laser beam having a predetermined plane of polarization as shown in FIG. 2B is passed through from the polarizer 5 and into the expander 6, while a second laserbeam 105 other than the first laser beam having a predetermined plane of polarization which has a plane of polarization as shown in FIG. 2E, is reflected by the polarizer 5, and then reflected by the reflecting mirror 13. The laser beam 102 which is expanded in regard to the beam flux diameter, to a degree dependent on the size of the liquid crystal device 7, by the expander 6, is modulated in accordance with the pattern stored in the RAM of the mask pattern control circuit 71.

In more detail, the LCD control circuit 72 applies a negative voltage of the level Vc only to the X-electrode $X_1$ through the X-driver 73 at the first sequence of a time sharing operation. At the same time, the LCD control circuit 72 applies a positive voltage of the level Vc to the electrodes selected in accordance with the first line of the pattern stored in RAM of the mask pattern control circuit 71 among the Y-electrodes $Y_1$ to $Y_n$ through the $Y_1$ to $Y_4$ drivers 74. As a result, a voltage of 2·Vc is applied to portions of letters across the X and Y-electrodes $X_1$ and $Y_1$ to $Y_n$ while a voltage of only Vc is applied to non-letter portions thereacross, parts of a third laser beam 103 which are passed through the letter portions are rotated in regard to the plane of polarization, for instance, by 180 degrees, while parts of the third laser beam 103 which are passed through the non-letter portions are rotated in regard to the plane of polarization, for instance, by 90 degrees. The resulting third laser beam 103 having two different planes of polarization orthogonal to each other is shown in FIG. 2C.

At the second sequence of time sharing operation, negative voltage of the level Vc is applied only to the X-electrode $X_2$ while positive voltage of the level Vc is applied to the Y-electrodes $Y_1$ to $Y_n$ in accordance with the second line of the pattern stored in RAM of the mask pattern control circuit 71. Thereafter, the same sequential time sharing control is repeated in the X-electrodes $X_3$ to $X_n$ in the same manner as explained above.

The third laser beam 103 passes through the analyser 8, and is separated into a fourth laser beam 104 having the plane of polarization as shown in FIG. 2D corresponding to the pattern stored in RAM of the mask pattern control circuit 71 (which has passed through the analyser 8), and a fifth laser beam 106 having the plane of polarization as shown in FIG. 2F, which is reflected by the analyser 8 and then is reflected by the reflecting mirror 14. The fourth laser beam 104 is focussed by the lens 9 whereby the pattern is marked on the article 10 with the fourth laser beam 104. On the other hand, the fifth laser beam 105 as shown in FIG. 2E is fed through the coupler 12 and the optical fiber 11 after being reflected by the reflecting mirror 13, back to the collimator 4. Further, the fifth laser beam 106 is also fed through the reducer 15, the coupler 16 and the optical fiber 17 after being reflected by the reflecting mirror 14, back to the collimator 4.

Figure 7A:
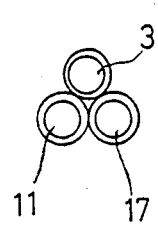
Figure 7B:
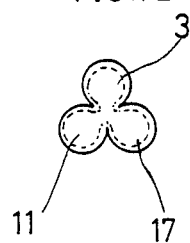
Figure 7C:
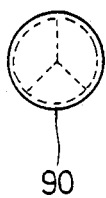

In FIGS. 7A to 7C, there are shown another embodiment of three optical fibers which are fused to each other to be assembled in a collimator according to the invention. In FIG. 7A, three optical fibers 3, 11 and 17 meet each other and are in close contact. In FIG. 7B, the three optical fibers are fused by being heated to be integral thereby resulting in approximately triangular shape. In FIG. 7C, a single optical fiber 90 is obtained to have a completely circular shape in the cross section thereof.

Although the invention has been described with respect to specific embodients thereof for complete and clear disclosure, the appended claims are not to be thus limited but are to be construed as embodying any modification or alternative constructing that may occur to one skilled in the art which fairly falls within the basic teaching herein set forth.

What is claimed is:

1. Method of marking a pattern on an article with a laser comprising the steps of:
   producing a first laser beam having a predetermined plane of polarization and a second laser beam having polarization different from that of said first laser beam from a non-polarized laser beam from said laser,
   generating a mask pattern with an electro-optical device through which said first laser beam is passed to produce a third laser beam having components having at least two different planes of polarization,
   selecting a fourth laser beam having one of said at least two planes of polarization from said third laser beam to mark said pattern on said article, and
   feeding back said second laser beam and a fifth laser beam selected from said third laser beam and comprising the components having at least a remaining one of said different planes of polarization that was not selected to be in said fourth laser beam, back to a stage previous to the mask pattern generating stage to be combined with said non-polarized laser beam from said laser to produce said first laser beam.

2. Method of marking a pattern on an article with a laser according to claim 1, wherein
   said step of producing said first laser beam comprises passing said non-polarized laser beam through a polarizer,
   said step of generating a mask pattern comprises driving a liquid crystal device in accordance with said pattern to be marked on said article, and
   said step of selecting said fourth laser beam comprises passing said third laser beam through an analyser.

3. Apparatus for marking a pattern on an article with a laser comprising:
   laser source means for generating a non-polarized laser beam,
   polarizer means responsive to said non-polarized laser beam for passing a first laser beam having a predetermined plane of polarization and for reflecting a second laser beam other than said first laser beam,
   means for producing a mask pattern by an electro-optical effect through which said first laser beam is passed to produce a third laser beam having at least two different planes of polarization,
   analyser means responsive to said third laser beam for passing a fourth laser beam having one of said at least two different planes of polarization and for reflecting a fifth laser beam which is not passed by said analyser means,
   means for focussing said fourth laser beam on said article to mark a pattern in accordance with said mask pattern thereon, and
   means for feeding said second laser beam and said fifth laser beam back to a stage previous to said polarizer means for combining said second and fifth laser beams with said non-polarized laser beam.

4. Apparatus for marking a pattern on an article with a laser according to claim 3, wherein
   said laser source means comprises a laser oscillator for producing said non-polarized laser beam and a collimator for collimating said non-polarized laser beam,
   said mask pattern generating means comprises a liquid crystal device in which a predetermined voltage is applied to electrodes corresponding to said pattern to be marked on said article,
   said feeding means comprises optical fibers through which said second and fifth beams are fed back to said collimator.

5. Apparatus for marking a pattern on an article with a laser according to claim 4, wherein
   said laser oscillator is connected through an optical fiber to said collimator, and
   said liquid crystal device is provided with non-reflecting layers for laser light at the outer surfaces thereof.

* * * * *